United States Patent
Kaku

(10) Patent No.: US 8,395,404 B2
(45) Date of Patent: Mar. 12, 2013

(54) ELECTRONIC DEVICE INCLUDING ELECTRONIC PART AND WIRING SUBSTRATE

(75) Inventor: Yoshifumi Kaku, Okazaki (JP)

(73) Assignee: DENSO CORPORATION, Kariya (JP)

( * ) Notice: Subject to any disclaimer, the term of this patent is extended or adjusted under 35 U.S.C. 154(b) by 375 days.

(21) Appl. No.: 12/662,342

(22) Filed: Apr. 13, 2010

(65) Prior Publication Data

US 2010/0264950 A1 Oct. 21, 2010

(30) Foreign Application Priority Data

Apr. 15, 2009 (JP) .................................. 2009-99304

(51) Int. Cl.
*G01R 31/3187* (2006.01)

(52) U.S. Cl. .................................................. 324/750.3

(58) Field of Classification Search .. 324/762.01–762.1, 324/750.01–750.3; 257/772, 778–779
See application file for complete search history.

(56) References Cited

U.S. PATENT DOCUMENTS

| | | | |
|---|---|---|---|
| 6,225,702 B1 | 5/2001 | Nakamura | |
| 7,183,652 B2 * | 2/2007 | Waidhas et al. | 257/772 |
| 2009/0065936 A1 * | 3/2009 | Ong et al. | 257/738 |

FOREIGN PATENT DOCUMENTS

| | | |
|---|---|---|
| JP | 09-246426 A | 9/1997 |
| JP | 10-056093 A | 2/1998 |
| JP | 2001-228191 A | 8/2001 |
| JP | 4072082 B2 | 10/2004 |
| JP | 2007-294620 A | 11/2007 |

OTHER PUBLICATIONS

Office Action dated Jun. 7, 2011 in corresponding JP application No. 2009-099304 (and English translation).

* cited by examiner

*Primary Examiner* — Tung X Nguyen
(74) *Attorney, Agent, or Firm* — Posz Law Group, PLC

(57) ABSTRACT

An electronic device includes an electronic part and a wiring substrate. The electronic part includes a rewiring substrate, a semiconductor chip, and solder bumps arranged in a matrix form. The wiring substrate includes a wire and lands arranged in a matrix form corresponding to the solder bumps. Each of the lands is coupled with corresponding one of the solder bumps so as to form connection portions. The connection portions include nonfunctional connection portions that do not provide an electric connection between the semiconductor chip and the wire. The lands forming the nonfunctional connection portions include a power source land and a ground land arranged next to each other in a row direction or a column direction. The lands that are arranged next to the lands forming the nonfunctional connection portions in the row direction or the column direction are set to signal lands.

17 Claims, 8 Drawing Sheets

ELECTRONIC DEVICE INCLUDING ELECTRONIC PART AND WIRING SUBSTRATE

CROSS REFERENCE TO RELATED APPLICATIONS

The present application is based on and claims priority to Japanese Patent Application No. 2009-99304 filed on Apr. 15, 2009, the contents of which are incorporated in their entirety herein by reference.

BACKGROUND OF THE INVENTION

1. Field of the Invention

The present invention relates to an electronic device including a wiring substrate and an electronic part mounted on the wiring substrate.

2. Description of the Related Art

From a standpoint of increase in speed, increase in the number of pins, and decrease in dimension, surface-mounted electronic parts such as a BGA (Ball Grid Array) and a CSP (Chip Scale Package) in which solder bumps are used as connecting terminals are better than packages such as a QFP (Quad Flat Package) in which leads are used. A surface-mounted electronic part includes a rewiring substrate (interposer) and a semiconductor chip. The rewiring substrate includes a first surface and a second surface. The semiconductor chip is mounted on the first surface of the rewiring substrate. A plurality of solder bumps is arranged on the second surface of the rewiring substrate in a matrix form. A wiring substrate has a plurality of lands corresponding to the solder bumps. The solder bumps are respectively coupled with the lands, and thereby the electronic part and the wiring substrate form an electronic device.

When a lead free solder is used, a reflow temperature at a time when the electronic part is mounted on the wiring substrate becomes higher than a case where a solder including lead is used. Thus, the electronic part may bend due to stress caused by a difference in linear expansion coefficients of the electronic part and the wiring substrate. When the electronic part bends, one or more of the solder bumps may collapse and adjacent solder bumps may short out. In the solder bumps arranged in the matrix form, the solder bumps arranged at the outermost periphery, especially, the solder bumps arranged at four corners are liable to collapse and short out.

Also under environment of usage, stress caused by the difference in the linear expansion coefficients of the electronic part and the wiring substrate is applied to connection portions formed by the solder bumps and the lands. In the solder bumps arranged in the matrix form, the solder bumps arranged in the outermost periphery, especially, the solder bumps arranged at four corners are liable to receive large stress. If the electronic device is disposed at a position exposed to a high temperature, such as, an inside of an engine room of a vehicle, the stress increases. Thus, the connection portions formed by the solder bumps and the lands arranged at the four corners are liable to clack. If the adjacent solder bumps are shorting out at a time when the electronic device is disposed in the environment of usage (for example, in the engine room), because the amount of solder at the connection portions decreases by the amount of solder deformed in a horizontal direction, the connection portions that are shorting out are liable to crack. If one connection portion cracks, the stress applied to the connection portions arranged inside the one connection portion increases. Thus, another connection portion arranged inside the one connection portion may also crack. That is, a crack may grow inward.

Therefore, before the electronic device is disposed in the environment of usage, an inspection of connection states of the connection portions of the solder bumps and the lands is required. However, since the electronic part is a surface-mounted type and the solder bumps are arranged in the matrix form, it is difficult to inspect the connections states of all the connection portions of the solder bumps and the lands by external appearance. The connection states can be inspected with an X-ray inspection apparatus, for example. However, because the X-ray inspection apparatus is expensive and it takes a long inspection time, production cost increases.

U.S. Pat. No. 6,225,702 (corresponding to Japanese Unexamined Patent Application Publication No. 11-74407) discloses a semiconductor device in which solder bumps that function as signal electrode terminals are disposed between solder bumps that function as power supply terminals and solder bumps that function as ground terminal, and a short circuit between adjacent bumps is detected by boundary scanning.

Japanese Unexamined Patent Application Publication No. 2001-228191 discloses a method in which some solder bumps arranged at the outermost periphery of a plurality of solder bumps and subjected to the largest mechanical strength due to a difference in thermal expansion coefficients of an electronic part and a wiring substrate are set to solder bumps for confirming connection states, and the connection states of the solder bumps for confirming connection states and corresponding lands of the wiring substrate are detected as a change in impedance.

Japanese Patent No. 4,072,082 discloses a semiconductor device in which solder bumps (pads) arranged at the outermost periphery and the solder bumps arranged inside the outermost periphery are set to solder bumps for power supply, and a resistor and a capacitor are coupled in series between a power source and the ground. In addition, the solder bumps arranged at four corners of the outermost periphery and having a possibility that defect of soldering occur are coupled with an end of the resistor adjacent to the power source, and the solder bumps arranged inside the outermost periphery are coupled with a connection portion of the resistor and the capacitor. Then, a voltage at the connection portion is compared with a reference voltage for determining whether defect of soldering is present.

Japanese Unexamined Patent Application Publication No. 2007-294620 discloses a semiconductor device in which conductive patterns as lands are provided on a rewiring substrate. In the conductive patterns, conductive patterns located at four corners do not provide electric connection between a semiconductor chip and wires of a wiring substrate. In other words, in the solder bumps (conductive balls) arranged in a matrix form, solder bumps located at the four corners are set to nonfunctional bumps that do not provide electric connection between the semiconductor chip and the wires of the wiring substrate. Thus, even if a short circuit or a crack occurs in the solder bumps located the four corners, the semiconductor device can restrict an operation problem.

In the semiconductor device disclosed in U.S. Pat. No. 6,225,702, all the solder bumps provide electric connection between the semiconductor chip and the wires of the wiring substrate. Thus, when a crack occurs at connection portions of the solder bumps and lands located at the outermost periphery, especially, at the four corners due to a stress caused by the difference in the linear expansion coefficients of the electronic part and the wiring substrate in environment of usage, the electronic device, specifically, a circuit in the semiconductor chip may operate abnormally. Therefore, a life of the electronic device may be short.

The semiconductor device disclosed in U.S. Pat. No. 6,225, 702 can be modified and the solder bumps can be set to nonfunctional bumps that do not provide electric connection between the semiconductor chip and the wires of the wiring substrate in a manner similar to the semiconductor device disclosed in Japanese Unexamined Patent Application Publication No. 2007-294620. In this case, a short circuit that occurs in the nonfunctional bumps cannot be detected.

In the semiconductor devices disclosed in Japanese Unexamined Patent Application Publication No. 2001-228191 and Japanese Patent No. 4,072,082, a short circuit cannot be detected.

SUMMARY OF THE INVENTION

In view of the foregoing problems, it is an object of the present invention to provide an electronic device that has a long life and is configured so that a short circuit can be detected.

An electronic device according to a first aspect of the present invention includes an electronic part and a wiring substrate. The electronic part includes a rewiring substrate, a semiconductor chip, and a plurality of solder bumps. The rewiring substrate has a first surface and a second surface being opposite each other. The semiconductor chip is mounted on the first surface. The solder bumps are arranged on the second surface in a matrix form in a row direction and a column direction. The solder bumps include a plurality of functional bumps and a plurality of nonfunctional bumps. The wiring substrate has an electronic-part mounted surface and includes a wire and a plurality of lands. The lands are arranged on the electronic-part mounted surface in a matrix form corresponding to the solder bumps. The lands include a plurality of functional lands and a plurality of nonfunctional lands. Each of the functional lands is coupled with a corresponding one of the functional bumps so as to form a plurality of functional connection portions that provides an electric connection between the semiconductor chip and the wire of the wiring substrate. Each of the nonfunctional lands is coupled with a corresponding one of the nonfunctional bumps so as to form a plurality of nonfunctional connection portions that does not provide an electric connection between the semiconductor chip and the wire of the wiring substrate. Each of the nonfunctional connection portions is arranged next to another one of the nonfunctional connection portions in at least one of the row direction and the column direction so as to form a nonfunctional connection portion group. The nonfunctional lands include a power source land fixed to a power source potential and a ground land fixed to a ground potential. The power source land and the ground land are arranged next to each other in the row direction or the column direction. The functional lands include a plurality of signal lands. Each of the plurality of signal lands is arranged next to one of the nonfunctional lands in the row direction or the column direction.

The electronic device according to the first aspect of the present invention can have a long life. In addition, a short circuit can be detected by detecting electric current that flows between a power source and a ground.

An electronic device according to a second aspect of the present invention includes an electronic part and a wiring substrate. The electronic part includes a rewiring substrate, a semiconductor chip, and a plurality of solder bumps. The rewiring substrate has a first surface and a second surface being opposite each other. The semiconductor chip is mounted on the first surface. The solder bumps are arranged on the second surface in a matrix form in a row direction and a column direction. The solder bumps include a plurality of functional bumps and a plurality of nonfunctional bumps. The wiring substrate has an electronic-part mounted surface and includes a wire and a plurality of lands. The lands are arranged on the electronic-part mounted surface in a matrix form corresponding to the solder bumps. The lands include a plurality of functional lands and a plurality of nonfunctional lands. Each of the functional lands is coupled with a corresponding one of the functional bumps so as to form a plurality of functional connection portions that provides an electric connection between the semiconductor chip and the wire of the wiring substrate. Each of the nonfunctional lands is coupled with a corresponding one of the nonfunctional bumps so as to form a plurality of nonfunctional connection portions that does not provide an electric connection between the semiconductor chip and the wire of the wiring substrate. Each of the nonfunctional connection portions is arranged next to another one of the nonfunctional connection portions in at least one of the row direction and the column direction so as to form a nonfunctional connection portion group. The plurality of nonfunctional bumps includes a power source bump fixed to a power source potential and a ground bump fixed to a ground potential. The power source bump and the ground bump are arranged next to each other in the row direction or the column direction. The functional bumps include a plurality of signal bumps. Each of the signal bumps is arranged next to one of the nonfunctional bumps in the row direction or the column direction.

The electronic device according to the second aspect of the present invention can have a long life. In addition, a short circuit can be detected by detecting electric current that flows between a power source and a ground.

An electronic device according to a third aspect of the present invention includes an electronic part and a wiring substrate. The electronic part includes a rewiring substrate, a semiconductor chip, and a plurality of solder bumps. The rewiring substrate has a first surface and a second surface being opposite each other. The semiconductor chip is mounted on the first surface. The solder bumps are arranged on the second surface in a matrix form in a row direction and a column direction. The solder bumps include a plurality of functional bumps and a plurality of nonfunctional bumps. The wiring substrate has an electronic-part mounted surface and includes a wire and a plurality of lands. The lands are arranged on the electronic-part mounted surface in a matrix form corresponding to the solder bumps. The lands include a plurality of functional lands and a plurality of nonfunctional lands. Each of the functional lands is coupled with a corresponding one of the functional bumps so as to form a plurality of functional connection portions that provides an electric connection between the semiconductor chip and the wire of the wiring substrate. Each of the nonfunctional lands is coupled with a corresponding one of the nonfunctional bumps so as to form a plurality of nonfunctional connection portions that does not provide an electric connection between the semiconductor chip and the wire of the wiring substrate. Each of the rewiring substrate and the wiring substrate has a plurality of connecting wires. Each of the connecting wires electrically couples two of the nonfunctional connection portions that are not arranged next to each other in the row direction and the column direction. All of the nonfunctional connection portions are coupled in series alternately through one of the connecting wires of the rewiring substrate and one of the connecting wires of the wiring substrate so as to form a daisy chain connection part. The daisy chain connection part is configured to be applied with a voltage and has a high potential end and a low potential end. The daisy chain connection part has a monitor terminal at the low potential end. A voltage at the monitor terminal is used as a monitor signal.

The electronic device according to the third aspect of the present invention can have a long life. In addition, a short circuit and an open circuit can be detected based on the monitor signal.

An electronic device according to a fourth aspect of the present invention includes an electronic part and a wiring substrate. The electronic part includes a rewiring substrate, a semiconductor chip, and a plurality of solder bumps. The rewiring substrate has a first surface and a second surface being opposite each other. The semiconductor chip is mounted on the first surface. The solder bumps are arranged on the second surface in a matrix form in a row direction and a column direction. The solder bumps include a plurality of functional bumps and a plurality of nonfunctional bumps. The wiring substrate has an electronic-part mounted surface and includes a wire and a plurality of lands. The lands are arranged on the electronic-part mounted surface in a matrix form corresponding to the solder bumps. The lands include a plurality of functional lands and a plurality of nonfunctional lands. Each of the functional lands is coupled with a corresponding one of the functional bumps so as to form a plurality of functional connection portions that provides an electric connection between the semiconductor chip and the wire of the wiring substrate. Each of the nonfunctional lands is coupled with a corresponding one of the nonfunctional bumps so as to form a plurality of nonfunctional connection portions that does not provide an electric connection between the semiconductor chip and the wire of the wiring substrate. Each of the rewiring substrate and the wiring substrate has a plurality of connecting wires. The connecting wires include a plurality of first connecting wires and a second connecting wire. Each of the first connecting wires electrically couples two of the nonfunctional connection portions that are not arranged next to each other in the row direction and the column direction. The second connecting wire has a voltage dividing resistor and electrically couples two of the nonfunctional connection portions that are arranged next to each other in the row direction or the column direction. All of the nonfunctional connection portions are coupled in series alternately through one of the connecting wires of the rewiring substrate and one of the connecting wires of the wiring substrate so as to form a daisy chain connection part. The daisy chain connection part is configured to be applied with a voltage and has a high potential end and a low potential end. The daisy chain connection part has a monitor terminal at the low potential end. The voltage at the monitor terminal is used as a monitor signal.

The electronic device according to the fourth aspect of the present invention can have a long life. In addition, a short circuit and an open circuit can be detected based on the monitor signal.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

First Embodiment

An electronic device 10 according to a first embodiment of the present invention will be described with reference to FIG. 1-FIG. 3.

Figure 1:
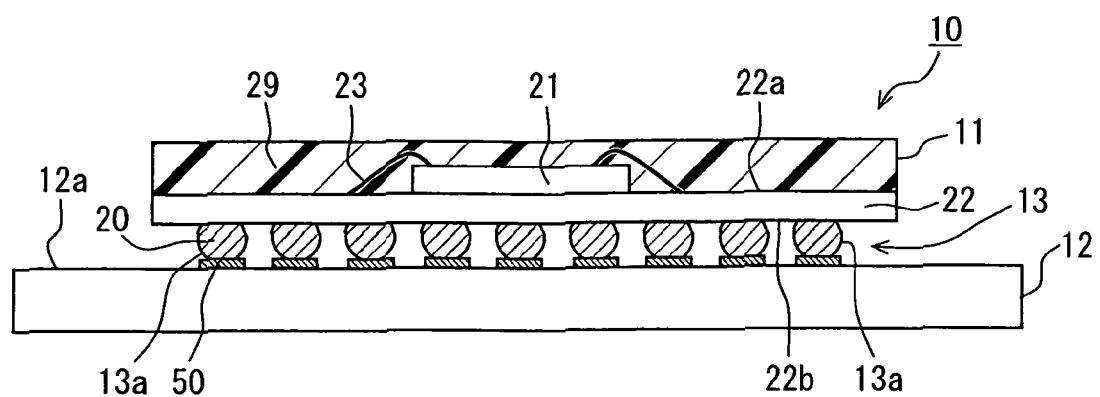
FIG. 1 is a cross-sectional view showing an electronic device according to a first embodiment of the present invention.
Figure 2:
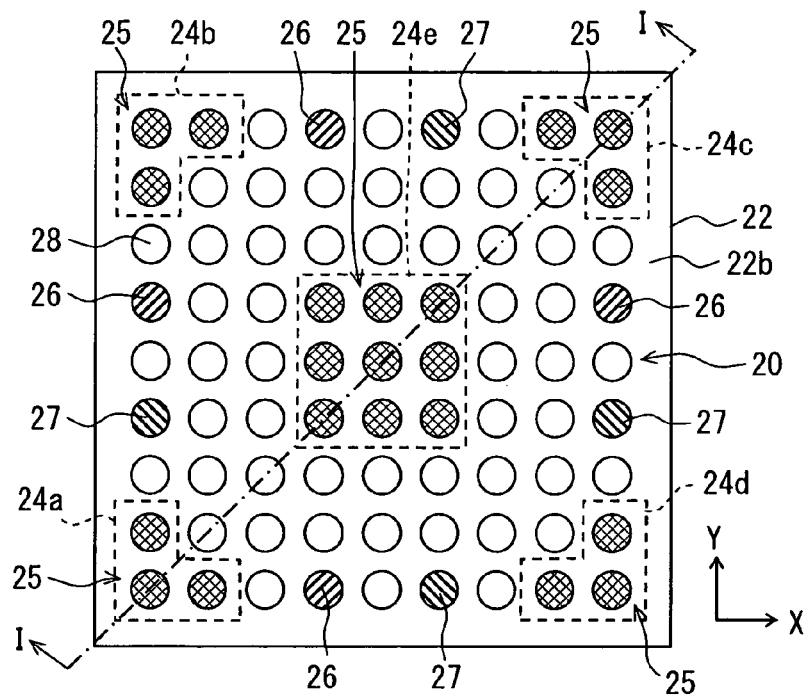
FIG. 2 is a plan view showing exemplary arrangement of solder bumps on a rewiring substrate according to the first embodiment.

As shown in FIG. 1, the electronic device 10 includes an electronic part 11 and a wiring substrate 12. The electronic part 11 has a plurality of solder bumps 20. The wiring substrate 12 has a plurality of lands 50. The solder bumps 20 are mechanically and electrically coupled with the lands 50, respectively.

The electronic part 11 is so-called semiconductor package (IC). The electronic part 11 includes a semiconductor chip 21 and a rewiring substrate 22. The rewiring surface includes a first surface 22a and a second surface 22b being opposite each other. The semiconductor chip 21 is fixed on the first surface 22a of the rewiring substrate 22. The solder bumps 20 are arranged on the second surface 22b of the rewiring substrate 22.

The semiconductor chip 21 includes a semiconductor substrate, elements, and a wiring layer. The substrate is made of, for example, single crystal silicon. The elements are formed on the semiconductor substrate, for example, by dispersion of impurities. The wiring layer is formed on the semiconductor substrate. The substrate, the elements, and the wiring layer form a logic circuit, a memory circuit, an A/D converting circuit, an amplifier circuit, or mixed circuit of the above-described circuits. In the present embodiment, the semiconductor chip 21 has an approximately rectangular planar shape and is adhered to the first surface 22a of the rewiring substrate 22. On a surface of the semiconductor chip 21 opposite from the rewiring substrate 22, a plurality of electrode pads (not shown) is formed.

The rewiring substrate 22 is so-called interposer. The rewiring substrate 22 includes a substrate and a plurality of wiring layers. The substrate is made of, for example, resin or ceramic. The wiring layers are made of conductive material such as copper. On the first surface 22a of the rewiring substrate 22, a plurality of lands (not shown) is formed. The lands are electrically coupled with the electrode pads of the semiconductor chip 21. In the present embodiment, the rewiring substrate 22 has an approximately rectangular planar shape. The lands are arranged in a peripheral region surrounding a chip mounted region of the first surface 22a along each side of the semiconductor chip 21 having the approximately rectangular planar shape. The lands are electrically coupled with the electrode pads of the semiconductor chip 21 through wires 23.

On the second surface 22b of the rewiring substrate 22, a plurality of lands (not shown) is formed in a matrix form. The solder bumps 20 are respectively formed on the lands in a matrix form.

In the present embodiment, the solder bumps 20 are made of tin (Sn) and silver (Ag) and have boll shapes. All the solder bumps 20 have the same shape and the same dimension. As shown in FIG. 2, the solder bumps 20 are arranged in a 9×9 matrix in a row direction shown by an X-axis and a column direction shown by a Y-axis on the second surface 22b of the rewiring substrate 22 having the approximately rectangular planar shape such as a square shape.

In each of four corner regions 24a-24d of a bump arranged region having an approximately rectangular planar shape (regions surrounded by dashed lines in FIG. 2), three nonfunctional bumps 25 are disposed. The nonfunctional bumps 25 do not provide electric connection between the semiconductor chip 21 and wires (not shown) of the wiring substrate 12. In the solder bumps 20 arranged in a rectangular shape at the outermost periphery, corner solder bumps arranged at four corners, solder bumps arranged next to the corner solder bumps in the row direction, and solder bumps arranged next to the corner solder bumps in the column direction are the nonfunctional bumps 25. Also in a center region 24e of the bump arrange region (a region surrounded by a dashed line in FIG. 2), nine nonfunctional bumps 25 are arranged in a 3×3 matrix in the row direction and column direction. The nonfunctional bumps 25 according to the present embodiment are disposed on corresponding lands of the rewiring substrate 22 that are free and are not electrically coupled with the wires of the rewiring substrate.

The solder bumps 20 except for the nonfunctional bumps 25 are functional bumps that provide electric connection between the semiconductor chip 21 and wires (not shown) of the wiring substrate 12. The functional bumps include power source bumps 26, ground bumps 27, and signal bumps 28. The power source bumps 26 are fixed to a power source potential. The ground bumps 27 are fixed to the ground potential. The signal bumps 28 transmit signals. The solder bumps 20 arranged next to the nonfunctional bumps 25 in the row direction and the column direction are the signal bumps 28.

The electronic part 11 is a BGA (ball grid array) electronic part. The electronic part 11 can be used for an electronic device including a portable information terminal equipment such as cellular phone, a memory module, and a CPU module.

The semiconductor chip 21 and the wires 23 are sealed with a resin member 29 formed on the first surface 22a of the rewiring substrate 22. The resin member 29 may be made of know material including, for example, phenolic curing agent, silicone rubber, and epoxy resin including fillers.

The wiring substrate 12 includes an insulating substrate and the wires (not shown) arranged on the insulating substrate. The insulating substrate may be made of resin or ceramic. The wires may be made of conductive material including copper. For example, the wiring substrate 12 includes an insulating material made of epoxy resin and multilayered wires made of copper. The wiring substrate 12 has an electronic-part mounted surface 12a. The lands 50 are arranged on the electronic-part mounted surface 12a so as to correspond to the solder bumps 20 as shown in FIG. 1 and FIG. 3. In other words, on the electronic-part mounted surface 12a of the wiring substrate 12, the lands 50 are arranged in a 9×9 matrix in the row direction and column direction so as to correspond to the solder bumps 20.

In each of four corner regions 51a-51d of a land arranged region having an approximately rectangular planar shape (regions surrounded by dashed lines in FIG. 3), three nonfunctional lands 52 are disposed. The nonfunctional lands 52 do not provide electric connection between the semiconductor chip 21 and the wires of the wiring substrate 12. In the lands 50 arranged in a rectangular shape at the outermost periphery, corner lands arranged at four corners, lands arranged next to the corner lands in the row direction, and lands arranged next to the corner lands in the column direction are the nonfunctional lands 52. Also in a center region 51e of the land arranged region (a region surrounded by a dashed line in FIG. 3), nine nonfunctional lands 52 are arranged in a 3×3 matrix in the row direction and column direction. The corner region 51a is opposite the corner region 24a, the corner region 51b is opposite the corner region 24b, the corner region 51c is opposite the corner region 24c, the corner region 51d is opposite the corner region 24d, and the center region 51e is opposite the center region 24e.

The nonfunctional lands 52 include power source lands 52a fixed to the power source potential and ground lands 52b fixed to the ground potential. The power source lands 52a and the ground lands 52b are arranged next to each other in the row direction and the column direction. In the present embodiment, as shown in FIG. 3, in each of the four corner regions 51a-51d, the nonfunctional land 52 located at the corner is set to the power source land 52a, and the other two nonfunctional lands 52 are set to the ground lands 52b. In the center regions 51e, the nonfunctional lands 52 located at four corners and the nonfunctional land 52 located at a center are set to the power source lands 52a, and the other four nonfunctional lands 52 are set to the ground lands 52b.

The lands 50 except for the nonfunctional lands 52 are functional lands that provide electric connection between the semiconductor chip 21 and the wires of the wiring substrate 12 with the corresponding solder bumps 20. The functional lands include power source lands 53, ground lands 54, and signal lands 55. The power source lands 53 are fixed to the power source potential. The ground lands 54 are fixed to the ground potential. The signal lands 55 transmit signals. The lands 50 that provide the electric connection and are arranged next to the nonfunctional lands 52 in the row direction and the column direction are the signal lands 55. The power source lands 53 correspond to the power source bumps 26, the ground lands 54 correspond to the ground bumps 27, and the signal lands 55 correspond to the signal bumps 28, respectively.

By bonding the solder bumps 20 of the electronic part 11 and the lands 50 of the wiring substrate 12, a plurality of connection portions 13 is formed as shown in FIG. 1. The connection portions 13 include a plurality of functional connection portions and a plurality of nonfunctional connection portions 13a. The functional connection portions are formed by the functional bumps and the functional lands and provide the electric connection between the semiconductor chip 21 and the wires of the wiring substrate 12. The nonfunctional connection portions 13a are formed by the nonfunctional bumps 25 and the nonfunctional lands 52 and do not provide electric connection between the semiconductor chip 21 and the wires of the wiring substrate 12. As arrangements of the nonfunctional bumps 25 and the nonfunctional lands 52 shown in FIG. 2 and FIG. 3, the nonfunctional connection portions 13a are arranged next to each other in at least one of the row direction and the column direction so as to form nonfunctional connection portion groups. Specifically, the nonfunctional connection portion group is formed in each pair of corner regions, that is, the corner region 24a and the corner region 51a, the corner region 24b and the corner region 51b, the corner region 24c and the corner region 51c, the corner region 24d and the corner region 51d, and the center region 24e and the center region 51e.

The solder bumps 20 may be directly bonded to the lands 50, respectively. Alternatively, solder paste may be disposed on the lands 50, and the connection portions 13 may include the solder paste. The electronic part 11 is mounted to a mounted region 56 of the electronic-part mounted surface 12a of the wiring substrate 12 surrounded by a dashed-two dotted line in FIG. 3.

In the present embodiment, a part of the connection portions 13 formed by the solder bumps 20 and the corresponding lands 50 is the nonfunctional connection portions 13a that do not provide electric connection between the semiconductor chip 21 and the wires of the wiring substrate 12. The nonfunctional connection portions 13a are arranged next to each other in at least one of the row direction and the column direction so as to form the nonfunctional connection portion groups. Thus, even if a crack occurs in the nonfunctional connection portions 13a due to stress caused by difference in the linear expansion coefficients of the electronic part 11 and the wiring substrate 12 in the environment of usage, the electric connection between the semiconductor chip 21 and the wires of the wiring substrate 12 can be secured.

In the electronic part 11, the nonfunctional bump 25 that form the nonfunctional connection portion group are disposed at the four corner regions 24a-24d of the second surface 22b of the rewiring substrate 22 having the rectangular planar shape. As described above, the stress caused by the difference in the linear expansion coefficients of the electronic part 11 and the wiring substrate 12 is liable to occur at the outermost periphery of the solder bumps 20 arranged in the matrix form, especially, at the four corners. Thus, the life of the electronic device 10 can be extended effectively.

In addition, the wiring substrate 12 has the power source lands 52a and the ground lands 52b as the nonfunctional lands 52 forming the nonfunctional connection portions 13a. The power source lands 52a and the ground lands 52b are arranged next to each other in the row direction or the column direction. When two of the nonfunctional connection portions 13a arranged next to each other in the row direction or the column direction short out, since one of the nonfunctional connection portions 13a is fixed to the ground potential and the other one of the nonfunctional connection portions 13a is fixed to the power source potential, a large current flows. Thus, a short circuit can be detected by detecting electric current that flows between the power source and the ground. A reference mark S1 in FIG. 3 indicates a state where the power source land 52a and the ground land 52b arranged next to each other in the row direction in the corner region 51d short out, that is, a state where two of the nonfunctional connection portions 13a arranged next to each other in the row direction short out.

Each of the lands 50 that provides the electric connection and is arranged next to one of the nonfunctional lands 52 in the row direction or the column direction is the signal land 55. Thus, a short circuit between one the nonfunctional connection portions 13a and one of the connection portions 13 that provides the electric connection and is adjacent to the nonfunctional connection function group can be detected by boundary scanning. A reference mark S2 in FIG. 3 indicates a state where the nonfunctional land 52 (the ground land 52b) and the signal land 55 arranged next to each other in the row direction short out.

As described above, the electronic device 10 according to the present embodiment can have a long life. In addition, a short circuit between adjacent connection portions 13 including the nonfunctional connection portions 13a can be electrically detected.

In the above-described example, the solder bumps 20 are arranged in the 9×9 matrix in the row direction and the column direction in a region having the rectangular planar shape. The arrangement of the solder bumps 20 is not limited to the above-described example. For example, the solder bumps 20 may also be arranged in a ring shape and the solder bumps 20 may also be arranged in such a manner that a part of the solder bumps 20 is arranged in a ring form and the other part of the solder bumps 20 is arranged inside the ring form in a rectangular form so that a clearance is provided between the ring form and the rectangular form.

The arrangement of the nonfunctional connection portion 13a, that is, the arrangement of the nonfunctional bumps 25 and the nonfunctional lands 52 is not limited to the above-described example. For example, the nonfunctional bumps 25 and the nonfunctional lands 52 may not be disposed in the center regions 24e and 51e.

The arrangement of the power source lands 52a and the ground lands 52b as the nonfunctional lands 52 is not limited to the above-described example. For example, the arrangement of the power source lands 52a and the ground lands 52b shown in FIG. 3 may be replaced.

Second Embodiment

An electronic device 10 according to a second embodiment of the present invention will be described with reference to FIG. 4 and FIG. 5.

Because the electronic device 10 according to the present embodiment has many portions in common with the electronic device 10 according to the first embodiment, a description of the common portions will be omitted and different portions will be mainly described. Components of the electronic device 10 according to the present embodiment have the same reference numbers as similar components of the electronic device 10 according to the first embodiment.

Figure 4:
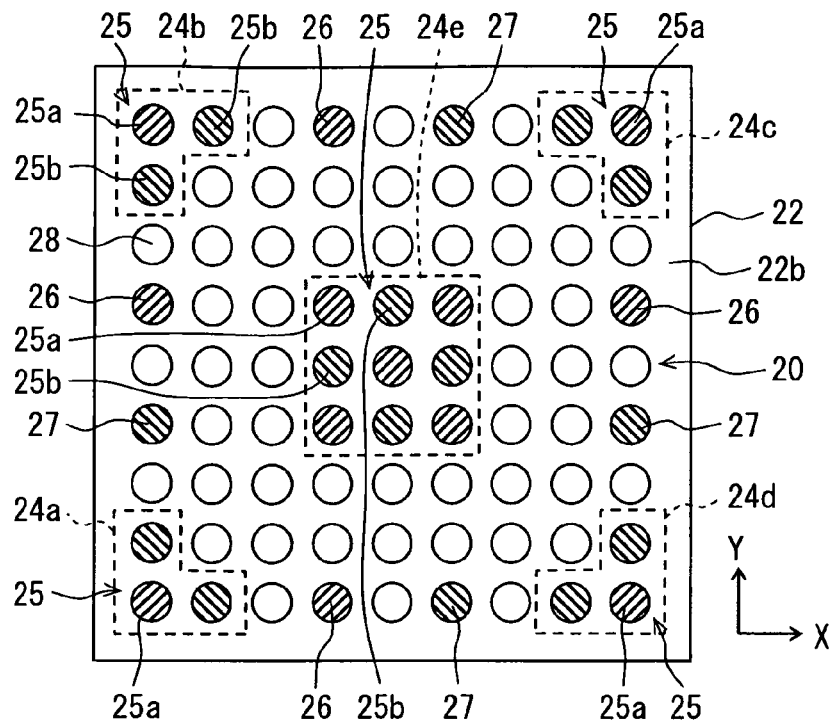
FIG. 4 is a plan view showing exemplary arrangement of solder bumps on a rewiring substrate according to a second embodiment of the present invention.
Figure 5:
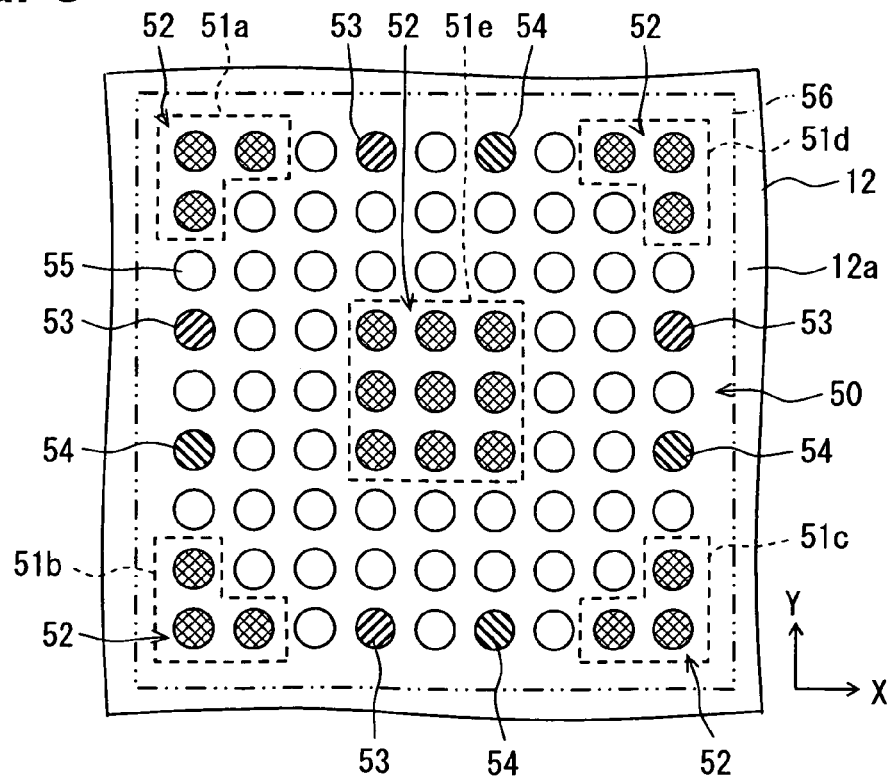
FIG. 5 is a plan view showing exemplary arrangement of lands on a wiring substrate according to the second embodiment.

In the present embodiment, in nonfunctional bumps 25 and nonfunctional lands 52 that form nonfunctional connection portions 13a, the nonfunctional bumps 25 includes power source bumps 25a fixed to the power source potential and ground bumps 25b fixed to the ground potential as shown in FIG. 4. The power source bumps 25a and the ground bumps 25b are coupled with wires of the rewiring substrate 22 through corresponding lands of the rewiring substrate 22, and thereby the power source bumps 25a are fixed to the power source potential and the ground bumps 25b are fixed to the ground potential. The nonfunctional lands 52 are free and are not electrically coupled with the wires of the wiring substrate 12 as shown in FIG. 5.

The power source bumps 25a and the ground bumps 25b are arranged next to each other in the row direction or the column direction. In the present embodiment, as shown in FIG. 4, in each of four corner regions 24a-24d, the nonfunctional bump 25 located at a corner is set to the power source bump 25a, and the other two nonfunctional bumps 25 are set to the ground bumps 25b. In addition, in a center region 24e, the nonfunctional bumps 25 located at four corners and the nonfunctional bump 25 located at a center are set to the power source bump 25a, and the other four nonfunctional bumps 25 are set to the ground lands 25b.

Each of the solder bumps 20 that provides the electric connection and is arranged next to one of the nonfunctional bumps 25 in the row direction or the column direction is a signal bump 28.

The electronic device 10 according to the present embodiment can have effects similar to the effects of the electronic device 10 according to the first embodiment.

Third Embodiment

An electronic device 10 according to a third embodiment of the present invention will be described with reference to FIG. 6 to FIG. 9.

Because the electronic device 10 according to the present embodiment has many portions in common with the electronic devices 10 according to the above-described embodiments, a description of the common portions will be omitted and different portions will be mainly described. Components of the electronic device 10 according to the present embodiment have the same reference numbers as similar components of the electronic device 10 according to the above-described embodiments.

Figure 6:
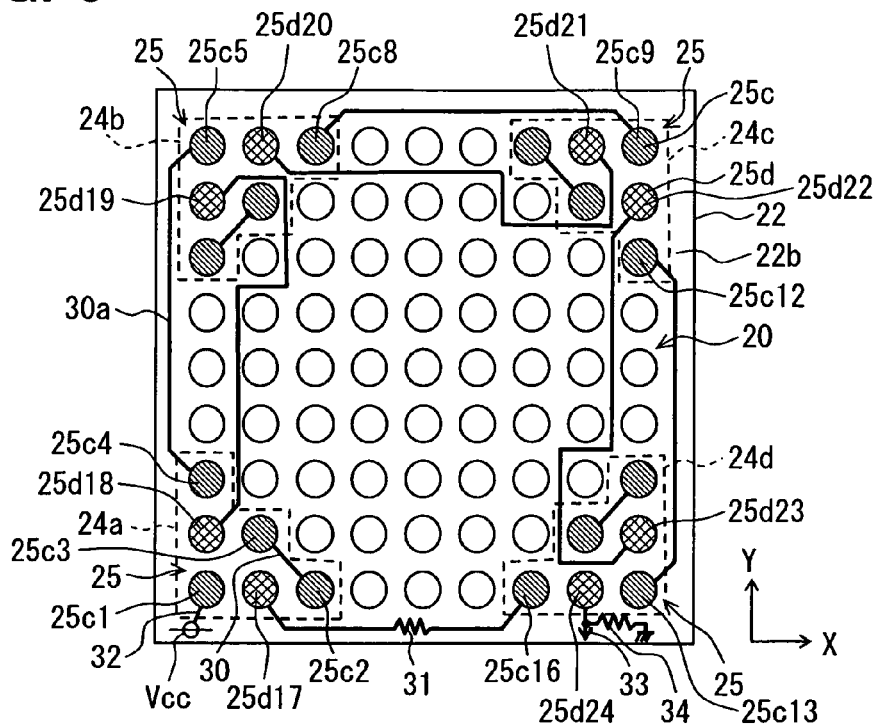
FIG. 6 is a plan view showing exemplary arrangement of solder bumps and connecting wires on a rewiring substrate according to a third embodiment of the present invention.

The electronic device 10 includes an electronic part 11, and a wiring substrate 12. The electronic part 11 has a plurality of solder bumps 20. The wiring substrate 12 has a plurality of lands 50. The solder bumps 20 are mechanically and electrically coupled with the lands 50, respectively. As shown in FIG. 6, the solder bumps 20 are arranged in a 9×9 matrix in the row direction and the column direction on a second surface 22b of a rewiring substrate 22 having an approximately rectangular planar shape. The lands 50 corresponding to the solder bumps 20 are also arranged in a 9×9 matrix in the row direction and the column direction on an electronic-part mounted surface 12a of the wiring substrate 12.

The solder bumps 20 and the corresponding lands 50 form connection portions 13. The connection portions 13 include a plurality of nonfunctional connection portions 13a that do not provide electric connection between the semiconductor chip 21 and wires of the wiring substrate 12. The solder bumps 20 that are arranged in four corner regions 24a-24d in a solder bump arranged region having an approximately rectangular planar shape are set to nonfunctional bumps 25. The lands 50 that are arranged in four corner regions 51a-51d corresponding to the four corner regions 24a-24d are set to nonfunctional lands 52. By bonding the nonfunctional bumps 25 and the nonfunctional lands 52, the nonfunctional connection portions 13a are formed.

In each of the corner regions 24a-24d, six nonfunctional bumps 25 that do not provide electric connection between the semiconductor chip 21 and the wires of the wiring substrate 12 are arranged. Specifically, in each of the corner regions 24a-24d, the solder bumps 20 located at the outermost periphery of the solder bumps 20 arranged in the approximately rectangular shape, a first solder bump 20 located at the corner, the third solder bumps 20 from the first solder bump 20 in the row direction and the column direction, and the solder bumps 20 located at each side of a triangle defined by the above-described three solder bumps 20, that is, the solder bumps 20 located between the above-described three solder bumps 20 are the nonfunctional bumps 25. The nonfunctional lands 52 are arranged so as to correspond to the nonfunctional bumps 25. In other words, in each of corner regions 51a-51d, six nonfunctional lands 52 that do not provide electric connection between the semiconductor chip 21 and the wires of the wiring substrate 12 are arranged.

The rewiring substrate 22 includes connecting wires 30. The wiring substrate 12 includes connecting wires 57. Each of the connecting wires 30 and 57 electrically couples two of the nonfunctional connection portions 13a that are not arranged next to each other in the row direction and the column direction. That is, each of the connecting wires 30 of the rewiring substrate 22 electrically couples two of the nonfunctional bumps 25 that are not arranged next to each other in the row direction and the column direction. Each of the connecting wires 57 of the wiring substrate 12 electrically couples two of the nonfunctional lands 52 that are not arranged next to each other in the row direction and the column direction.

The two of the nonfunctional connection portions 13a that are not arranged next to each other in the row direction and the column direction may be any two of the nonfunctional connection portions 13a between which at least one of the connection portions 13 including the nonfunctional connection portions 13a is arranged in the row direction or the column direction. Two of the nonfunctional connection portions 13a arranged next to each other in an oblique direction have a longer distance therebetween than two of the nonfunctional connection portions 13a arranged next to each other in the row direction or the column direction. Thus, two of the nonfunctional connection portions 13a arranged next to each other in an oblique direction can be electrically coupled with the connecting wires 30 or the connecting wires 57.

Figure 8:
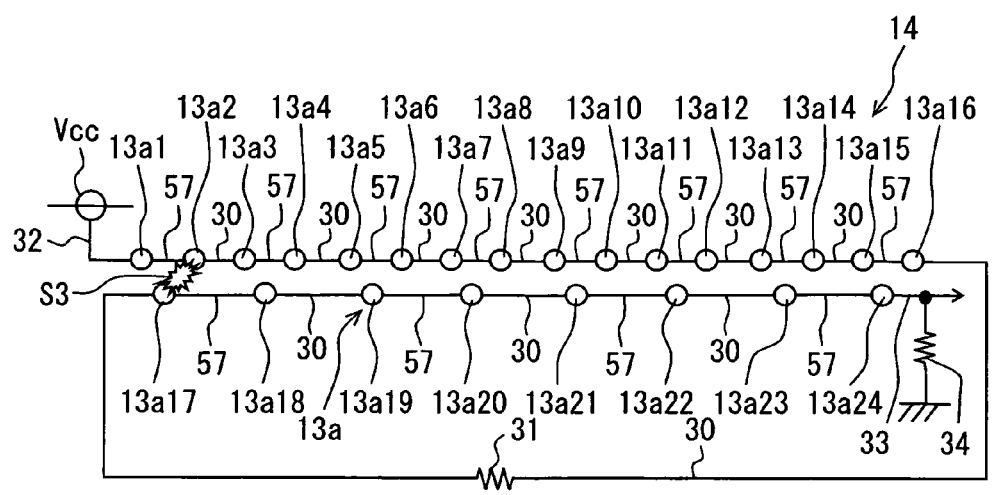
FIG. 8 is a diagram for explaining a daisy chain connection part according to the third embodiment.

The electronic device 10 includes a daisy chain connection part 14 provided by coupling all the nonfunctional connection portions 13a in series alternately through the connecting wire 30 of the rewiring substrate 22 and the connecting wire 57 of the wiring substrate 12. In the present embodiment, the total number of the nonfunctional connection portions 13a arranged in the corner regions 24a-24d and 51a-51d is twenty-four. As shown in FIG. 8, the nonfunctional connection portion 13a arranged adjacent to the power source Vcc is called a first nonfunctional connection portion 13a1 and the nonfunctional connection portion 13a arranged adjacent to the ground is called a twenty-fourth nonfunctional connection portion 13a24. The nonfunctional connection portions 13a coupled between the first nonfunctional connection portion 13a1 and the twenty-fourth nonfunctional connection portion 13a24 are called second to twenty-third nonfunctional connection portions 13a2-13a23. The first nonfunctional connection portion 13a1 and the second nonfunctional connection portion 13a2 are electrically coupled through the connecting wire 57 of the wiring substrate 12, the second nonfunctional connection portion 13a2 and the third nonfunctional connection portion 13a3 are electrically coupled through the connecting wire 30 of the rewiring substrate 22, and the third nonfunctional connection portion 13a3 and the fourth nonfunctional connection portion 13a4 are electrically coupled through the connecting wire 57 of the wiring substrate 12. In the above-described way, in the daisy chain connection part 14, two of the nonfunctional connection portion 13 are coupled alternately through the connecting wire 30 and the connecting wire 57 so that all the nonfunctional connection portions 13a1-13a24 are electrically coupled in series.

In the present embodiment, a voltage dividing resistor 31 is inserted in the connecting wire 30 that couples the sixteenth nonfunctional connection portion 13a16 and the seventeenth nonfunctional connection portion 13a17. That is, the voltage dividing resistor 31 is provided on the rewiring substrate 22. The nonfunctional bumps 25 and the nonfunctional lands 52 that form the nonfunctional connection portions 13a1-13a16 coupled between the power source Vcc and the connecting wire 30 having the voltage dividing resistor 31 are called nonfunctional bumps 25c and nonfunctional lands 52c, respectively. The nonfunctional bumps 25 and the nonfunctional lands 52 that form the nonfunctional connection portions 13a17-13a24 coupled between the connecting wire 30 having the voltage dividing resistor 31 and the ground are called nonfunctional bumps 25d and nonfunctional lands 52d, respectively. In addition, corresponding to the order of the nonfunctional connection portions 13a from the power source to the ground, the nonfunctional bump 25c and the nonfunctional land 52c that form the first nonfunctional connection portion 13a1 are called a nonfunctional bump 25c1 and a nonfunctional land 52c1, respectively, and the nonfunctional bump 25d and the nonfunctional land 52d that form the twenty-fourth nonfunctional connection portion 13a24 are called a nonfunctional bump 25d24 and a nonfunctional land 52d24, respectively.

As shown FIG. 6, in the corner region 24a, the nonfunctional bump 25c1 located at the corner and one of the vertices of the triangle is coupled with the power source Vcc through a wire 32 of the rewiring substrate 22. The power source Vcc may be a power source line of the rewiring substrate 22, for example. That is, in the daisy chain connection part 14, the nonfunctional bump 25c1 is at a high potential end adjacent to the power source Vcc. The nonfunctional land 52c1 that forms the first nonfunctional connection portion 13a1 with the nonfunctional bump 25c1 is coupled with the nonfunctional land 52c2 through the connecting wire 57. The nonfunctional land 52c2 is the third nonfunctional land 52 from the nonfunctional land 52c1 in the row direction and is located at one of the vertices of the triangle. The nonfunctional bump 25c2 that forms the second nonfunctional connection portion 13a2 with the nonfunctional land 52c2 is coupled with the nonfunctional bump 25c3 arranged next to the nonfunctional bump 25c2 in an oblique direction through the connecting wire 30. The nonfunctional land 52c3 that forms the third nonfunctional connection portion 13a3 with the nonfunctional connection bump 25c3 is coupled with the nonfunctional land 52c4 through the connecting wire 57. The nonfunctional land 52c4 is the third nonfunctional land 52 from the nonfunctional land 52c1 in the column direction and is located at another one of vertices of the triangle. Accordingly, in a pair of the corner regions 24a and 51a, the nonfunctional connection portions 13a1-13a4 between the power source Vcc and the connecting wire 30 having the voltage dividing resistor 31 are coupled.

The nonfunctional bump 25c4 that forms the fourth nonfunctional connection portion 13a4 with the nonfunctional land 52c4 in the corner region 51b is coupled with the nonfunctional bump 25c5 through the connecting wire 30. The nonfunctional bump 25c5 is arranged at the corner of the corner region 24b and is located at one of vertices of the triangle. The connecting wire 30 coupling the nonfunctional bump 25c4 and the nonfunctional bump 25c5 is a long wire 30a. The long wire 30a electrically couples two of the nonfunctional connection portions 13a across another two or more of the connection portions 13. The long wire 30a is formed on the rewiring substrate 22. In a pair of the corner regions 24b and 51b, the nonfunctional connection portions 13a5-13a8 are coupled through the connecting wires 30 and 57 in a manner similar to the four nonfunctional connection portions 13a1-13a4 in the pair of corner regions 24a and 51a.

The nonfunctional bump 25c8 in the corner region 24c is coupled with the nonfunctional bump 25c9 through a long wire 30a. The nonfunctional bump 25c9 is arranged at the corner of the corner region 24c and is located at one of vertices of the triangle. In a pair of the corner regions 24c and 51c, the nonfunctional connection portions 13a9-13a12 are coupled through the connecting wires 30 and 57 in a manner similar to the nonfunctional connection portions 13a1-13a4. The nonfunctional bump 25c12 in the corner region 24d is coupled with the nonfunctional bump 25c13 through a long wire 30a. The nonfunctional bump 25c9 is arranged at the corner of the corner region 24d and is located at one of vertices of the triangle. In a pair of the corner regions 24d and 51d, the nonfunctional connection portions 13a13-13a16 are coupled through the connecting wires 30 and 57 in a manner similar to the nonfunctional connection portions 13a1-13a4.

In the above-described way, the nonfunctional connection portions 13a1-13a16 between the power source Vcc and the connecting wire 30 having the voltage dividing resistor 31 are coupled.

In the two nonfunctional bumps 25d in the corner region 24a, the nonfunctional bump 25d17 closer to the corner region 24d is coupled with the nonfunctional bump 25c16 through the connecting wire 30 having, the voltage dividing resistor 31. The nonfunctional land 52d17 that forms the seventeenth nonfunctional connection portion 13a17 with the nonfunctional bump 25d17 is coupled with the nonfunctional land 52d18 arranged next to the nonfunctional land 52d17 in an oblique direction through the connecting wire 57. Accordingly, in the pair of the corner region 24a and 51a, the nonfunctional connection portions 13a17 and 13a18 are coupled.

In the two nonfunctional bumps 25d in the corner region 24a, the nonfunctional bump 25d18 closer to the corner region 24b is coupled with the nonfunctional bump 25d19 in the corner region 24b closer to the corner region 24a through a long wire 30a. In the pair of the corner regions 24b and 51b, the nonfunctional connection portions 13a19 and 13a20 are coupled through the connecting wires 30 and 57 in a manner similar to the nonfunctional connection portions 13a17 and 13a18. In the two nonfunctional bumps 25d in the corner region 24b, the nonfunctional bump 25d20 closer to the corner region 24c is, coupled with the nonfunctional bump 25d21 in the corner region 24c closer to the corner region 24b through a long wire 30a. In the pair of corner regions 24c and 51c, the nonfunctional connection portions 13a21 and 13a22 are coupled through the connecting wires 30 and 57 in a manner similar to the nonfunctional connection portions 13a17 and 13a18. In the nonfunctional bumps 25d in the corner region 24c, the nonfunctional bump 25d22 closer to the corner region 24d is coupled with the nonfunctional bump 25d23 in the corner region 24d closer to the corner region 24c through a long wire 30a. In the pair of the corner regions 24d and 51d, the nonfunctional connection portions 13a23 and 13a24 are coupled through the connecting wires 30 and 57 in a manner similar to the nonfunctional connection portions 13a17 and 13a18.

In the above-described way, the nonfunctional connection portions 13a17-13a24 between the connecting wire 30 having the voltage dividing resistor 31 and the ground are coupled. In other words, in the daisy chain connection part 14, the nonfunctional connection portions 13a1-13a4 in the pair of corner regions 24a and 51a, the nonfunctional connection portions 13a5-13a8 in the pair of corner regions 24b and 51b, the nonfunctional connection portions 13a9-13a12 in the pair of corner regions 24c and 51c, the nonfunctional connection portions 13a13-13a16 in the pair of corner regions 24d and 51d, the voltage dividing resistor 31, the nonfunctional connection portions 13a17 and 13a18 in the pair of corner regions 24a and 51a, the nonfunctional connection portions 13a19 and 13a20, in the pair of corner regions 24b and 51b, the nonfunctional connection portions 13a21 and 13a22 in the pair of corner regions 24c and 51c, and the nonfunctional connection portions 13a23 and 13a24 in the pair of corner regions 24d and 51d are coupled in this order from the power source Vcc to the ground. The nonfunctional bump 25d24 is at a low potential end of the daisy chain connection part 14 adjacent to the ground. The nonfunctional bump 25d24 can function as a monitor terminal. In any two of the nonfunctional connection portions 13a arranged next to each other in the row direction or the column direction, one is coupled between the connecting wire 30 having the voltage dividing resistor 31 and the ground, and the other is coupled between the power source Vcc and the connecting wire 30 having the voltage dividing resistor 31.

The nonfunctional bump 25d24 as the monitor terminal is coupled with a wire 33 formed on the rewiring substrate 22 so that a voltage at the nonfunctional bump 25d24 can be detected as a monitor signal. The wire 33 is coupled with the ground through a pull down resistor 34. Accordingly, the monitor signal is transmitted to the wiring substrate 12 through the wire 33.

Figure 3:
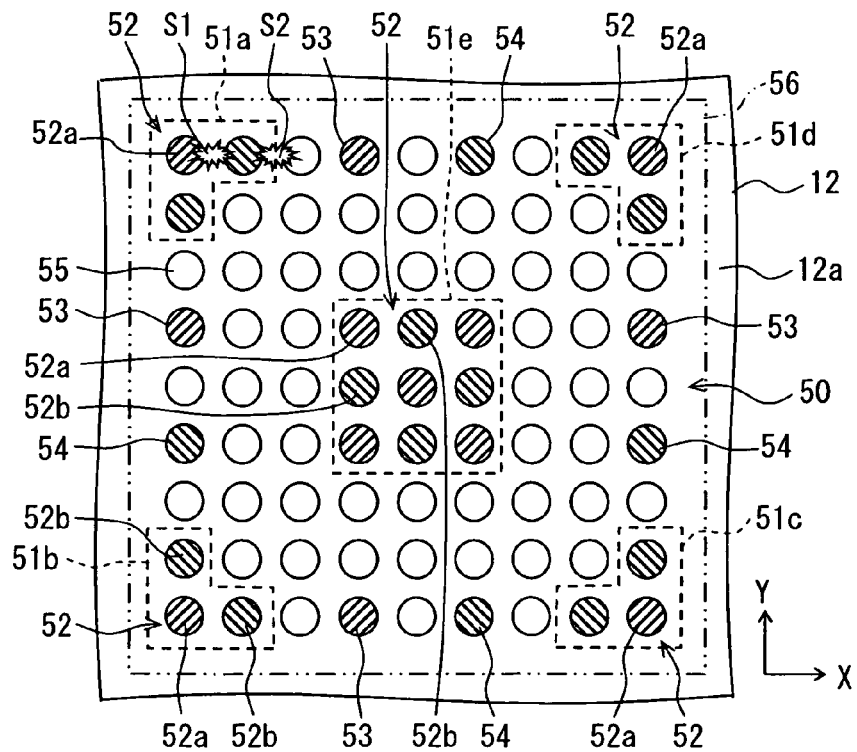
FIG. 3 is a plan view showing exemplary arrangement of lands on a wiring substrate according to the first embodiment.

For example, if the nonfunctional land 52c2 and the nonfunctional land 52c17 arranged next to each other in the row direction short out as shown by S3 in FIG. 3, that is, if the second nonfunctional connection portion 13a2 and the seventeenth nonfunctional connection portion 13a17 short out as shown by S3 in FIG. 8, a length of an electric current path from the power source Vcc to the monitor terminal becomes short, and the electric current path without passing through the voltage dividing resistor 31 is provided. Therefore, a voltage of the monitor signal becomes substantially the same as the power source voltage. If the nonfunctional bump 25 and the nonfunctional land 52 opens in one of the nonfunctional connection portions 13a in the daisy chain connection part 14, since the nonfunctional bump 25d24 as the monitor terminal is not electrically coupled with the power source Vcc, the voltage of the monitor signal becomes substantially the same as the ground potential. In a normal state where neither of a short circuit nor an open circuit occurs, since the voltage dividing resistor 31 and the pull down resistor 34 are coupled between the power source Vcc and the ground, the voltage of the monitor signal becomes a value same as the power source voltage divided by the voltage dividing resistor 31 and the pull down resistor 34. For example, the voltage dividing resistor 31 and the pull down resistor 34 are set so that the voltage of the monitor signal becomes about a half of the power source voltage in the normal state. For example, when the power source voltage is about 5 V, the voltage of the monitor signal becomes about 2.5 V.

Figure 9:
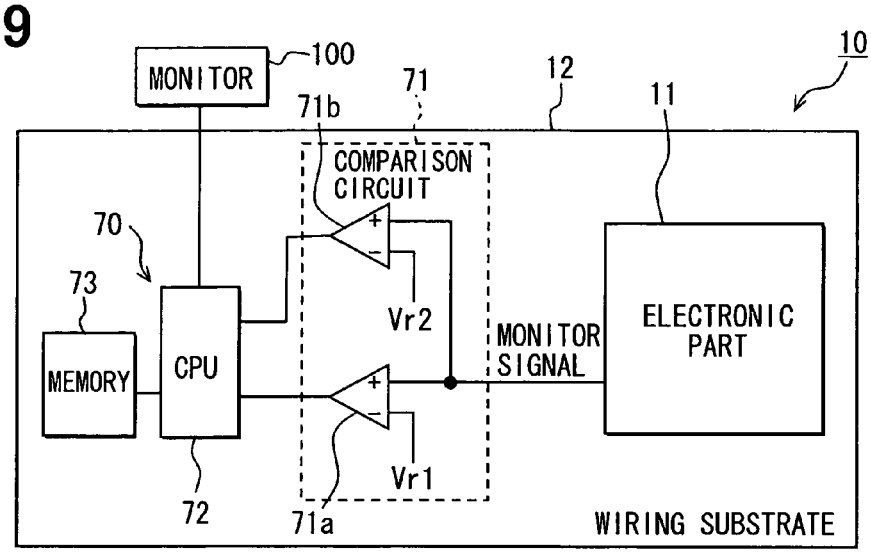
FIG. 9 is a diagram showing a detection circuit for detecting a connection state of the daisy chain connection part according to the third embodiment.

A detection circuit 70 for detecting a connection state of the nonfunctional connection portions 13a based on the monitor signal will be described below. As shown in FIG. 9, the detection circuit 70 includes a comparison circuit 71 and a central processing unit (CPU) 72. The comparison circuit 71 compares the monitor signal with a reference voltage. The CPU 72 is a determination circuit for determining the connection state of the nonfunctional connection portions 13a.

The detection circuit 70 is formed on the wiring substrate 12. The nonfunctional bump 25d24 as the monitor terminal is coupled with the wires of the wiring substrate 12 and the detection circuit 70 through the wires 33 of the rewiring substrate 22 and a nonfunctional connection portion different from the nonfunctional connection portions 13a.

The comparison circuit 71 includes two comparators 71a and 71b. The monitor signal is input to one input terminal (for example, non-inverting terminal) of each of the comparators 71a and 71b. The other input terminals of the comparators 71a and 71b are coupled with predetermined reference voltages Vr1 and Vr2, respectively. The reference voltage Vr1 and Vr2 are lower than the power source Vcc and are different from each other. The reference voltage Vr1 is set to a voltage between the ground voltage, that is, the voltage of the monitor signal in a state where an open-circuit occurs and the voltage of the monitor signal in the normal state. The reference voltage Vr2 is set to a voltage between the voltage of the monitor signal in the normal state and the power source potential, that is, the voltage of the monitor signal in a case where a short circuit occurs. When a short circuit occurs, both output signals of the comparators 71a and 71b become high level. When an open circuit occurs, both output signals of the comparators 71a and 71b become low level. In the normal state, the output signal of the comparator 71a is at the high level, and the output signal of the comparator 71b is at the low level.

The output signals of the comparators 71a and 71b are input to the CPU 72. The CPU 72 determines whether the connection state is the normal state, a state where an open circuit occurs, or a state where a short circuit occurs based on the output, signals of the comparators 71a and 71b. In an example shown in FIG. 9, the comparison circuit 71 includes the two comparators 71a and 71b. If a reference voltage can be changed at a predetermined time, the comparison circuit 71 may also consist of only one comparator.

On the wiring substrate 12, a nonvolatile memory 73 such as an electrically erasable programmable read-only memory (EEPROM) and a flash memory is disposed. If the CPU 72 determines that a short circuit or an open circuit occurs, the CPU 72 writes the determination result in the nonvolatile memory 73 so that a failure analysis becomes easy.

The electronic device 10 outputs the detection result by the detection circuit 70 to an external warning device. For example, the electronic device 10 is coupled with a monitor device 100, and the CPU 72 executes a process based on a program stored in a read-only memory (not shown) so that the determination result is displayed on the monitor device 100. Thus, in the manufacturing process of the electronic device 10, an operator can easily check the connection state of the nonfunctional connection portions 13a, that is, the connection state of the daisy chain connection part 14.

As described above, the electronic device 10 includes the nonfunctional connection portions 13a as a part of the connection portion 13 formed by the solder bumps 20 and the lands 50. Thus, even if a crack occurs in the nonfunctional connection portion 13a due to stress caused by difference in the linear expansion coefficients of the electronic part 11 and the wiring substrate 12 in the environment of usage, the electric connection between the semiconductor chip 21 and the wires of the wiring substrate 12 can be secured. Therefore, the life of the electronic device 10 can be extended.

The nonfunctional connection portions 13a are arranged next to each other in at least one of the row direction and the column direction and form the nonfunctional connection function group. The electronic part 11 includes a group of the nonfunctional bumps 25 arranged in each of corner regions 24a-24d of the second surface 22b of the rewiring substrate 22 having the rectangular planar shape. As described above, the stress caused by the difference in the linear expansion coefficients of the electronic part 11 and the wiring substrate 12 is liable to occur at the outermost periphery of the solder bumps 20 arranged in the matrix form, especially, at the four corners. Thus, life of the electronic device 10 can be extended effectively.

The nonfunctional connection portions 13a1-13a24 are coupled in series alternately through the connecting wire 30 of the rewiring substrate 22 and the connecting wire 57 of the wiring substrate 12, and all the nonfunctional connection portion 13a and the connecting wires 30 and 57 form the daisy chain connection part 14. Each of the connecting wires 30 and 57 electrically couples two of the nonfunctional connection portions 13a that are not arranged next to each other in the row direction and the column direction. Thus, if a short circuit occurs, the electric current path changes and a wire resistance provided by the connecting wires 30 and 57 and the nonfunctional connection portions 13a changes. Therefore, a short circuit as well as an open circuit can be detected based on the monitor signal.

In the present embodiment, the voltage dividing resistor 31 is inserted in one of the connecting wires 30 and 57 in the daisy chain connection part 14. Because the voltage dividing resistor 31 as well as the wire resistance are provided, the difference in voltage among the normal state, a state where an open circuit occurs, and a state where a short circuit occurs becomes large. Thus, the electronic device 10 can electrically detect the connection state of the daisy chain connection part 14 easily.

Furthermore, in any two of nonfunctional connection portions 13a arranged next to each other in the row direction or the column direction, one is coupled between the connecting wire 30 having the voltage dividing resistor 31 and the ground, and the other is coupled between the power source Vcc and the connecting wire 30 having the voltage dividing resistor 31. Thus, if a short circuit occurs between two of the nonfunctional connection portions 13a arranged next to each other in the row direction or the column direction, the electric current path becomes a shortcut without passing through the voltage dividing resistor 31.

As a result, the electronic device 10 according to the present embodiment can have a long life and can electrically detect a short circuit between the nonfunctional connection portions 13a. Furthermore, the electronic device 10 can detect an open circuit as well as a short circuit.

In the present embodiment, the voltage dividing resistor 31 and the pull down resistor 34 are formed on the rewiring substrate 22 attached to the electronic part 11. Thus, the dimension of the wiring substrate 12 can be reduced, and thereby the dimension of the electronic device 10 can be reduced. However, at least one of the voltage dividing resistor 31 and the pull down resistor 34 may also be formed on the wiring substrate 12.

In the wiring substrate 12 and the rewiring substrate 22, the long wires 30a that couple two of the nonfunctional connection portions 13a across another two or more of the connection portions 13 are formed on the rewiring substrate 22. On the wiring substrate 12, the wires (not shown) coupled with the lands 50 that provide the electric connection are pulled out of the mounted region 56 shown by a dashed-two dotted line in FIG. 7. By forming the long wire 30a being large in length on the rewiring substrate 22, art work of the wiring substrate 12 becomes easy, and manufacturing processes of the wiring substrate 12 and the rewiring substrate 22 are simplified. However, a long wire for electrically coupling two of the nonfunctional connection portions 13a across another two or more of the connection portions 13 may also be formed on the wiring substrate 12.

In the example shown in FIG. 9, the electronic device 10 includes the detection circuit 70 for detecting whether the connection state of the nonfunctional connection portion 13a is the normal state, a state where an open circuit occurs, or a state where a short circuit occurs based on the monitor signal. Thus, the electronic device 10 can detect the connection state of the nonfunctional connection portions 13a by itself.

Figure 10:
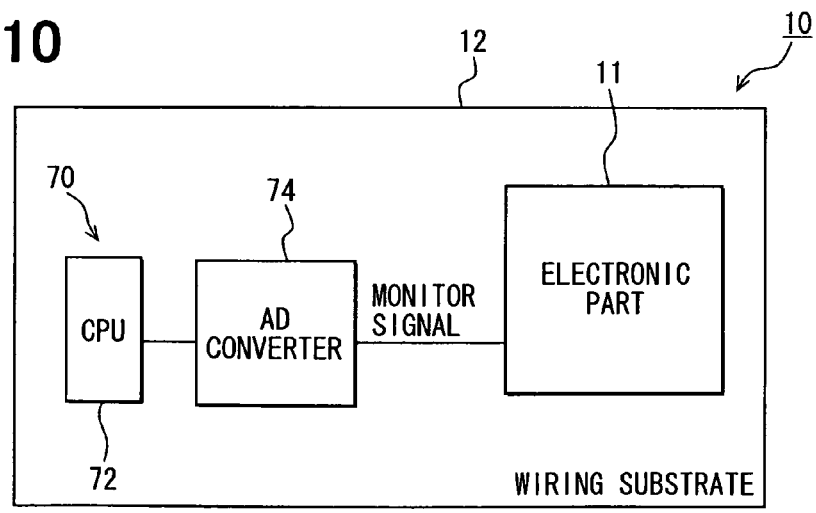
FIG. 10 is a diagram showing a detection circuit according to a modification.

The detection circuit 70 may also be provided separately from the electronic part 11 (semiconductor chip 21). The detection circuit 70 may also include an analog-digital (AD) converter 74 and a CPU 72 as shown in FIG. 10. The AD converter 74 converts the monitor signal from an analog signal into a digital signal. The CPU 72 determines the connection state of the nonfunctional connection portions 13a (daisy chain connection part 14) based on the digital signal from the AD converter 74. In this case, the comparison circuit 71 can be omitted. Thus, the dimension of the wiring substrate 12 can be reduced, and thereby the dimension of the electronic device 10 can be reduced.

Figure 11:
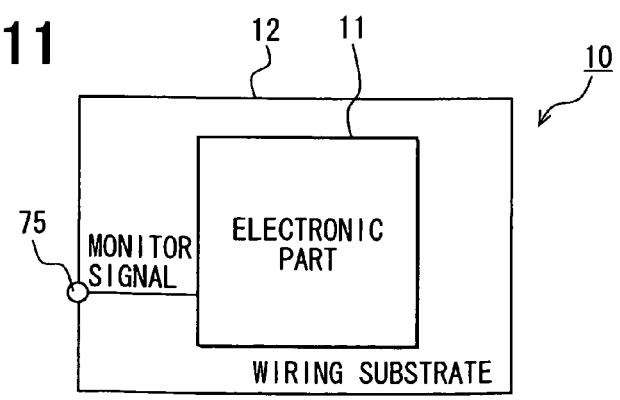
FIG. 11 is a diagram showing a modification of a wiring substrate.

Alternatively, an external device may include the detection circuit 70 and may detect the connection state of the nonfunctional connection portions 13a (daisy chain connection part 14) through a pad 75 formed on the wiring substrate 12 as shown in FIG. 11.

In the example shown in FIG. 9, the monitor device 100 is provided as a warning device. The warning device may also be a lighting element such as a light emitting diode (LED) or a sound device such as a buzzer. An element (for example, LED) mounted on the wiring substrate 12 may also used as the warning device. That is, the warning device may also be provided on the wiring substrate 12. The warning device may also execute a predetermined process based on the output signal of the comparison circuit 71 not the output signal of the CPU 72.

A configuration of the daisy chain connection part 14 is not limited to the above-described example. For example, one of the nonfunctional lands 52 may be set to a monitor terminal or a terminal coupled with the power source Vcc. The number of nonfunctional bumps 25 and the nonfunctional lands 52 in each of the corner regions 24a-24d and 51a-51d are not limited to the above-described example. Ways of coupling with the connecting wires 30 and 57 are not limited to the above-described example. Each of the connecting wires 30 and 57 may couple any two of the nonfunctional connection portions 13a that are not arranged next to each other in the row direction and the column direction. However, the way shown in FIG. 6-FIG. 8 can simplify the couplings with the connecting wires 30 of the rewiring substrate 22 and connecting wires 57 of the wiring substrate 12.

Figure 7:
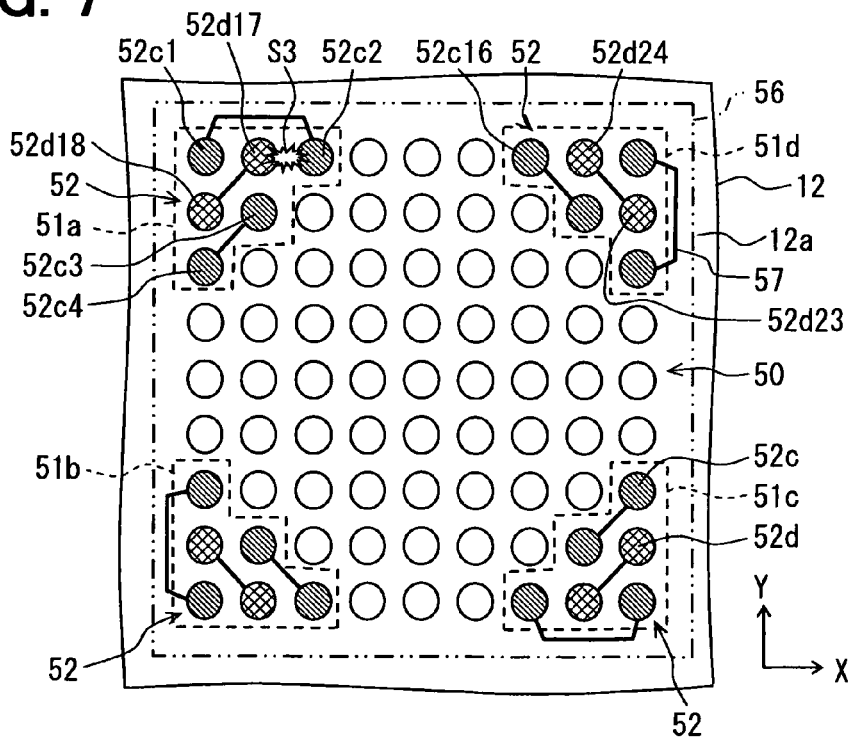
FIG. 7 is a plan view showing exemplary arrangement of lands and connecting wires on a wiring substrate according to the third embodiment.

In the example shown in FIG. 6-FIG. 8, the daisy chain connection part 14 includes the voltage dividing resistor 31 and the pull down resistor 34. At least one of the voltage dividing resistor 31 and the pull down resistor 34 may be omitted. Also in this case, if a short circuit occurs, the wire resistance changes from the wire resistance in the normal state. Thus, the electronic device 10 can detect whether the connection state is the normal state, a state where an open circuit occurs, or a state where a short circuit occurs.

Fourth Embodiment

An electronic device 10 according to a fourth embodiment of the present embodiment will be described with reference to FIG. 12-FIG. 14.

Because the electronic device 10 according to the present embodiment have many portions in common with the electronic devices 10 according to the above-described embodiments, especially, the third embodiment, a description of the common portions will be omitted and different portions will be mainly described. Components of the electronic device 10 according to the present embodiment have the same reference numbers as similar components of the electronic device 10 according to the above-described embodiments.

The electronic device 10 according to the present embodiment is similar to the electronic device 10 according to the third embodiment. In the electronic device 10 according to the third embodiment, two of the nonfunctional connection portions 13a that are not arranged next to each other in the row direction and the column direction are coupled alternatively through the connecting wire 30 and the connecting wire 57 so as to form the daisy chain connection part 14. That is, all the connecting wires 30 and 57 couple two of the nonfunctional connection portions 13a that are not arranged next to each other in the row direction and the column direction. The electronic device 10 according to the present embodiment includes an adjacencies connecting wire 30b coupling two of the nonfunctional connection portions 13a that are arranged next to each other in the row direction or the column direction as well as the connecting wires 30 and 57. The connecting wires 30 (including 29a) and 57 coupling two of the nonfunctional connection portion 13a that are not arranged next to each other can function as first connecting wires, and the adjacencies connecting wire 30 can function as a second connecting wire. In this way, the electronic device 10 according to the present embodiment includes the connecting wires 30 (including 29a), 57 and the adjacencies connecting wire 30b as connecting wires for coupling two of the nonfunctional connecting portions 13a.

Figure 12:
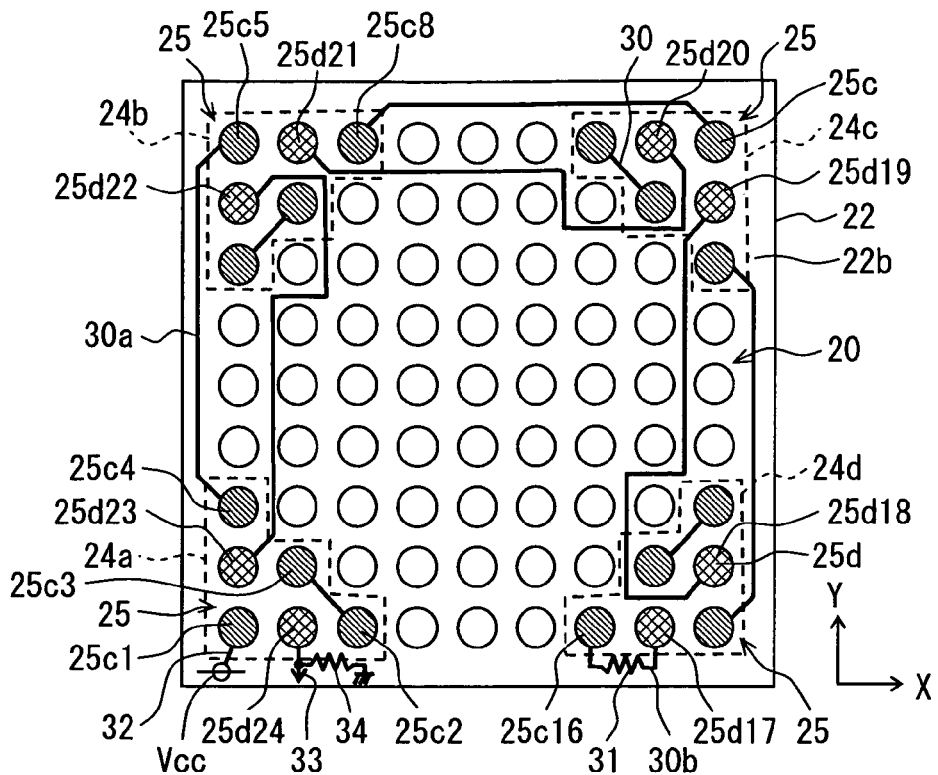
FIG. 12 is a plan view showing exemplary arrangement of solder bumps and connecting wires on a rewiring substrate according to a fourth embodiment of the present invention.
Figure 13:
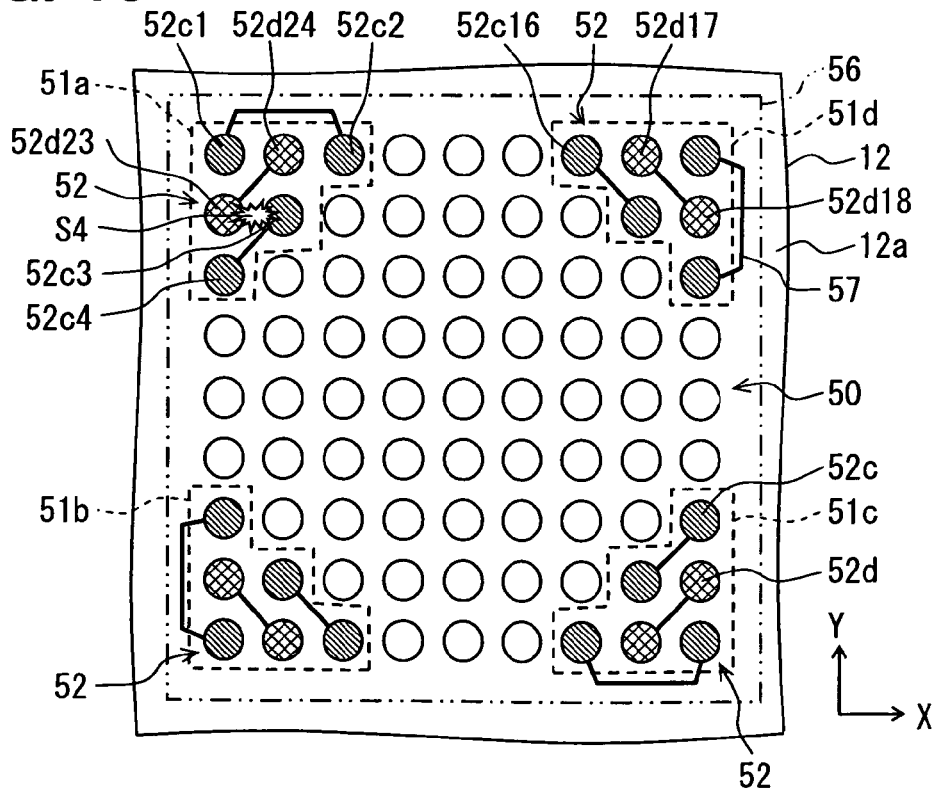
FIG. 13 is a plan view showing exemplary arrangement of lands and connecting wires on a wiring substrate according to the fourth embodiment.
Figure 14:
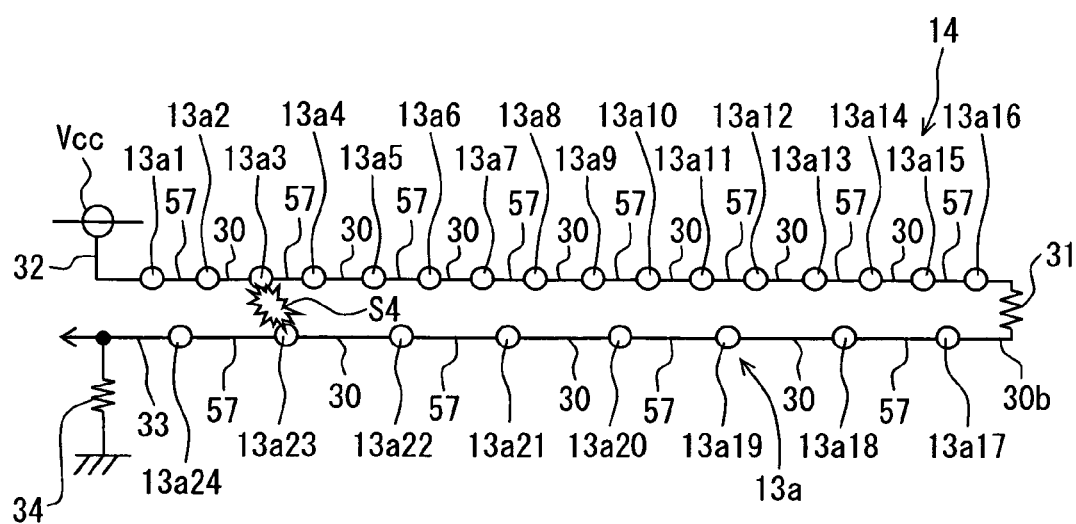
FIG. 14 is a diagram for explaining a daisy chain connection part according to the third embodiment.

In an example shown in FIG. 12-FIG. 14, the adjacencies connecting wire 30b is formed on the rewiring substrate 22, and a voltage dividing resistor 31 is inserted in the adjacencies connecting wire 30b. The adjacencies connecting wires 30b couples the sixteenth nonfunctional connection portion 13a16 (the nonfunctional bump 25c16) and the seventeenth nonfunctional connection portion 13a17 (the nonfunctional bump 25c17).

The way of coupling between the power source Vcc and the sixteenth nonfunctional connection portion 13a16 is similar to that of the third embodiment. In the corner region 24d, the nonfunctional bump 25d16 and the nonfunctional bump 25d17 are arranged next to each other in the row direction, and the nonfunctional bump 25d16 and the nonfunctional bump 25d17 are coupled through the adjacencies connecting wire 30b having the voltage dividing resistor 31, as shown in FIG. 12. The nonfunctional land 52d17 that forms the seventeenth nonfunctional connection portion 13a17 with the nonfunctional bump 25d17 is coupled with the nonfunctional land 52d18 arranged next to the nonfunctional land 52d17 in an oblique direction through the connecting wire 57. Accordingly, in the pair of the corner regions 24d and 51d, the nonfunctional connection portions 13a17 and 13a18 between the adjacencies connecting wire 30b and the ground are coupled.

In the two nonfunctional bumps 25d in the corner region 24d, the nonfunctional bump 25d18 closer to the corner region 24c is coupled with the nonfunctional bump 25d19 in the corner region 24c closer to the corner region 24d through the long wire 30a. In the pair of corner regions 24c and 51c, the nonfunctional connection portions 13a19 and 13a20 between the adjacencies connecting wire 30b and the ground are coupled through the connecting wires 30 and 57 in a manner similar to the nonfunctional connection portions 13a17 and 13a18. In the two nonfunctional bumps 25d in the corner region 24c, the nonfunctional bump 25d20 closer to the corner region 24b is coupled with the nonfunctional bump 25d21 in the corner region 24b closer to the corner region 24c through the long wire 30a. In the pair of corner regions 24b and 51b, the nonfunctional connection portions 13a21 and 13a22 between the adjacencies connecting wire 30b and the ground are coupled through the connecting wires 30 and 57 in a manner similar to the nonfunctional connection portions 13a17 and 13a18. In the two remaining nonfunctional bumps 25d in the corner region 24b, the nonfunctional bump 25d22 closer to the corner region 24a is coupled with the nonfunctional bump 25d23 in the corner region 24a closer to the corner region 24b through the long wire 30a. In the pair of corner regions 24a and 51a, the nonfunctional connection portions 13a23 and 13a24 between the adjacencies connecting wire 30b and the ground are coupled through the connecting wires 30 and 57 in a manner similar to the nonfunctional connection portions 13a17 and 13a18.

In the above-described way, the nonfunctional connection portions 13a17-13a24 between the adjacencies connecting wire 30b having the voltage dividing resistor 31 and the ground are coupled, and the daisy chain connection part 14 is formed.

Thus, in the daisy chain connection part 14, the nonfunctional connection portions 13a1-13a4 in the pair of corner regions 24a and 51a, the nonfunctional connection portions 13a5-13a8 in the pair of corner regions 24b and 51b, the nonfunctional connection portions 13a9-13a12 in the pair of corner regions 24c and 51c, the nonfunctional connection portions 13a13-13a16 in the pair of corner regions 24d and 51d, the voltage dividing resistor 31 (the adjacencies connecting wire 30b), the nonfunctional connection portions 13a17 and 13a18 in the pair of corner regions 24d and 51d, the nonfunctional connection portions 13a19 and 13a20 in the pair of corner regions 24c and 51c, the nonfunctional connection portions 13a21 and 13a22 in the pair of corner regions 24b and 51b, and the nonfunctional connection portions 13a23 and 13a24 in the pair of corner regions 24a and 51a are coupled in this order from the power source Vcc to the ground. The coupling order is reversed at the adjacencies connecting wire 30b having the voltage dividing resistor 31. Thus, both the terminal coupled with the power source Vcc through the wire 32 and the nonfunctional bump 25d24 as the monitor terminal, that is, both of the high potential end and the low potential end of the daisy chain connection part 14 are located in the pair of the corner regions 24a and 51a.

The electronic device 10 according to the present embodiment can have effects similar to the effects of the electronic device 10 according to the third embodiment. In the adjacencies connecting wire 30b, the voltage dividing resistor 31 is inserted. Thus, even if the nonfunctional connection portions 13a16 and 13a17 coupled through the adjacencies connecting wire 30b short out, the electronic device 10 can detect whether the connection state is the normal state or a state where a short out occurs. The detection circuit 70 and various modifications described in the third embodiment can be applied to the electronic device 10 according to the present embodiment.

Since the electronic device 10 includes the adjacencies connecting wire 30b coupling two of the nonfunctional connection portion 13a that are arranged next to each other in the row direction or the column direction, the number of the long wires 30a can be reduced from seven to six compared with the electronic device 10 according to the third embodiment. Thus, the artwork of the rewiring substrate 22 can be simplified.

In the example shown in FIG. 12, the adjacencies connecting wire 30b couples two of the nonfunctional connection portions 13a (the nonfunctional bumps 25) that are arranged next to each other in the row direction. The adjacencies connecting wire 30 may also couple two of the nonfunctional connection portions 13a that are arranged next to each other in the column direction. The adjacencies connecting wire 30b having the voltage dividing resistor 31 may also be formed on the wiring substrate 12.

Although the present invention has been fully described in connection with the exemplary embodiments thereof with reference to the accompanying drawings, it is to be noted that various changes and modifications will become apparent to those skilled in the art.

What is claimed is:

1. An electronic device comprising:
an electronic part including a rewiring substrate, a semiconductor chip, and a plurality of solder bumps, the rewiring substrate having a rectangular planar shape and having a first surface and a second surface being opposite each other, the semiconductor chip mounted on the first surface, the plurality of solder bumps arranged on the second surface in a matrix form in a row direction and a column direction, the plurality of solder bumps including a plurality of functional bumps and a plurality of nonfunctional bumps; and
a wiring substrate having an electronic-pail mounted surface and including a wire and a plurality of lands, the plurality of lands arranged on the electronic-part mounted surface in a matrix form corresponding to the plurality of solder bumps, the plurality of lands including a plurality of functional lands and a plurality of nonfunctional lands, each of the plurality of functional lands coupled with a corresponding one of the plurality of functional bumps so as to form a plurality of functional connection portions that provides an electric connection between the semiconductor chip and the wire of the wiring substrate, each of the plurality of nonfunctional lands coupled with a corresponding one of the plurality of nonfunctional bumps so as to form a plurality of nonfunctional connection portions that does not provide an electric connection between the semiconductor chip and the wire of the wiring substrate, wherein:
each of the plurality of nonfunctional connection portions is arranged next to another one of the plurality of nonfunctional connection portions in at least one of the row direction and the column direction so as to form a nonfunctional connection portion group;
the plurality of nonfunctional lands includes a power source land fixed to a power source potential and a ground land fixed to a ground potential;
the power source land and the ground land are arranged next to each other in the row direction or the column direction;
a short circuit between the nonfunctional connection portion including the power source land and the nonfunctional connection portion including the ground land is detectable by detecting an electric current that flows between the power source and the ground;
the plurality of nonfunctional bumps is arranged in four corner regions of the second surface of the rewiring substrate;
the plurality of functional lands includes a plurality of signal lands; and
each of the plurality of signal lands is arranged next to one of the plurality of nonfunctional lands in the row direction or the column direction.

2. An electronic device comprising:
an electronic part including a rewiring substrate, a semiconductor chip, and a plurality of solder bumps, the rewiring substrate having a rectangular planar shape and having a first surface and a second surface being opposite each other, the semiconductor chip mounted on the first surface, the plurality of solder bumps arranged on the second surface in a matrix form in a row direction and a column direction, the plurality of solder humps including a plurality of functional bumps and a plurality of nonfunctional bumps; and
a wiring substrate having an electronic-part mounted surface and including a wire and a plurality of lands, the plurality of lands arranged on the electronic-part mounted surface in a matrix form corresponding to the plurality of solder bumps, the plurality of lands including a plurality of functional lands and a plurality of nonfunctional lands, each of the plurality of functional lands coupled with a corresponding one of the plurality of functional bumps so as to form a plurality of functional connection portions that provides an electric connection between the semiconductor chip and the wire of the wiring substrate, each of the plurality of nonfunctional lands coupled with a corresponding one of the plurality of nonfunctional bumps so as to form a plurality of nonfunctional connection portions that does not provide an electric connection between the semiconductor chip and the wire of the wiring substrate, wherein:
each of the plurality of nonfunctional connection portions is arranged next to another one of the plurality of nonfunctional connection portions in at least one of the row direction and the column direction so as to form a nonfunctional connection portion group;
the plurality of nonfunctional bumps includes a power source bump fixed to a power source potential and a ground bump fixed to a ground potential;
the power source bump and the ground bump are arranged next to each other in the row direction or the column direction;
a short circuit between the nonfunctional connection portion including the power source bump and the nonfunctional connection portion including the ground bump is detectable by detecting an electric current that flows between the power source and the ground;
the plurality of nonfunctional bumps is arranged in four corner regions of the second surface of the rewiring substrate;
the plurality of functional bumps includes a plurality of signal bumps; and
each of the plurality of signal bumps is arranged next to one of the plurality of nonfunctional bumps in the row direction or the column direction.

3. An electronic device comprising:
an electronic part including a rewiring substrate, a semiconductor chip, and a plurality of solder bumps, the rewiring substrate having a first surface and a second surface being opposite each other, the semiconductor chip mounted on the first surface, the plurality of solder bumps arranged on the second surface in a matrix form in a row direction and a column direction, the plurality of solder bumps including a plurality of functional bumps and a plurality of nonfunctional bumps; and
a wiring substrate having an electronic-part mounted surface and including a wire and a plurality of lands, the plurality of lands arranged on the electronic-part mounted surface in a matrix form corresponding to the plurality of solder bumps, the plurality of lands including a plurality of functional lands and a plurality of nonfunctional lands, each of the plurality of functional lands coupled with a corresponding one of the plurality of functional bumps so as to form a plurality of functional connection portions that provides an electric connection between the semiconductor chip and the wire of the wiring substrate, each of the plurality of nonfunctional lands coupled with a corresponding one of the plurality of nonfunctional bumps so as to form a plurality of nonfunctional connection portions that does not provide an electric connection between the semiconductor chip and the wire of the wiring substrate, wherein:

each of the rewiring substrate and the wiring substrate has a plurality of connecting wires;

each of the plurality of connecting wires electrically couples two of the plurality of nonfunctional connection portions that are not arranged next to each other in the row direction and the column direction;

all of the plurality of nonfunctional connection portions are coupled in series alternately through one of the plurality of connecting wires of the rewiring substrate and one of the plurality of connecting wires of the wiring substrate so as to form a daisy chain connection part;

the daisy chain connection part is configured to be applied with a voltage and has a high potential end and a low potential end;

the daisy chain connection part has a monitor terminal at the low potential end; and a voltage at the monitor terminal is used as a monitor signal.

4. The electronic device according to claim 3, wherein the daisy chain connection part includes a voltage dividing resistor, and the voltage dividing resistor is inserted in one of the plurality of connecting wires.

5. The electronic device according to claim 4, wherein all of the plurality of nonfunctional connection portions are coupled in such a manner that, in any two of the plurality of nonfunctional connection portions arranged next to each other in the row direction or the column direction, one is coupled between the high potential end and the one of the plurality of connecting wires in which the voltage dividing resistor is inserted and the other one is coupled between the one of the plurality of connecting wires in which the voltage dividing resistor is inserted and the monitor terminal.

6. The electronic device according to claim 4, wherein the voltage dividing resistor is disposed on the electronic part.

7. The electronic device according to claim 3, wherein:
each of the plurality of nonfunctional connection portions is arranged next to another one of the plurality of nonfunctional connection portions in at least one of the row direction and the column direction so as to form a nonfunctional connection portion group;

the rewiring substrate has an approximately rectangular planar shape; and the plurality of nonfunctional solder bumps is arranged in four corner regions of the second surface of the rewiring substrate.

8. The electronic device according to claim 3, wherein the plurality of connecting wires of the rewiring substrate includes a long wire, and the long wire couples two of the plurality of nonfunctional connection portions across two or more of connection portions included in the plurality of nonfunctional connection portions and the plurality of functional connection portions.

9. The electronic device according to claim 3, wherein one of the wiring substrate and the electronic part includes a detection circuit that detects whether a connection state of the plurality of nonfunctional connection portions is a normal state, a state where a short circuit occurs, or a state where an open circuit occurs based on the monitor signal.

10. The electronic device according to claim 9, wherein the detection circuit includes a comparison circuit that compares the monitor signal with a reference voltage.

11. The electronic device according to claim 10, wherein the detection circuit further includes a determination circuit that determines the connection state of the plurality of nonfunctional connection portions based on an output signal of the comparison circuit.

12. The electronic device according to claim 9, wherein:
the detection circuit includes an analog-digital converter and a determination circuit;

the analog-digital converter converts the monitor signal from an analog signal to a digital signal; and the determination circuit determines the connection state of the plurality of nonfunctional connection portions based on the digital signal from the analog-digital converter.

13. The electronic device according to claim 9, wherein one of the wiring substrate and the electronic part includes a nonvolatile memory that stores a detection result of the connection state by the detection circuit.

14. The electronic device according to claim 9, wherein the detection circuit is configured to be coupled with an external warning device and is configured to transmit a detection result of the connection state to the external warning device.

15. The electronic device according to claim 3, wherein the wiring substrate further includes a pad electrically coupled with the monitor terminal, and the pad is configured to be coupled with an external device.

16. An electronic device comprising:
an electronic part including a rewiring substrate, a semiconductor chip, and a plurality of solder bumps, the rewiring substrate having a first surface and a second surface being opposite each other, the semiconductor chip mounted on the first surface, the plurality of solder bumps arranged on the second surface in a matrix form in a row direction and a column direction, the plurality of solder bumps including a plurality of functional bumps and a plurality of nonfunctional bumps; and a wiring substrate having an electronic-part mounted surface and including a wire and a plurality of lands, the plurality of lands arranged on the electronic-part mounted surface in a matrix form corresponding to the plurality of solder bumps, the plurality of lands including a plurality of functional lands and a plurality of nonfunctional lands, each of the plurality of functional lands coupled with a corresponding one of the plurality of functional humps so as to form a plurality of functional connection portions that provides an electric connection between the semiconductor chip and the wire of the wiring substrate, each of the plurality of nonfunctional lands coupled with a corresponding one of the plurality of nonfunctional bumps so as to form a plurality of nonfunctional connection portions that does not provide an electric connection between the semiconductor chip and the wire of the wiring substrate, wherein:

each of the rewiring substrate and the wiring substrate has a plurality of connecting wires;

the plurality of connecting wires includes a plurality of first connecting wires and a second connecting wire;

each of the plurality of first connecting wires electrically couples two of the plurality of nonfunctional connection portions that are not arranged next to each other in the row direction and the column direction;

the second connecting wire has a voltage dividing resistor and electrically couples two of the plurality of nonfunctional connection portions that are arranged next to each other in the row direction or the column direction;

all of the plurality of nonfunctional connection portions are coupled in series alternately through one of the plurality of connecting wires of the rewiring substrate and one of the plurality of connecting wires of the wiring substrate so as to form a daisy chain connection part;

the daisy chain connection part is configured to be applied with a voltage and has a high potential end and a low potential end;

the daisy chain connection part has a monitor terminal at the low potential end; and a voltage at the monitor terminal is used as a monitor signal.

17. The electronic device according to claim 16, wherein all of the plurality of nonfunctional connection portions are coupled in such a manner that, in any two of the plurality of nonfunctional connections portions arranged next to each other in the row direction or the column direction, one is coupled between the high potential end and the second connecting wire and the other one is coupled between the second connecting wire and the monitor terminal.

* * * * *